US010663520B2

(12) United States Patent
Park et al.

(10) Patent No.: US 10,663,520 B2
(45) Date of Patent: May 26, 2020

(54) METHOD AND APPARATUS FOR REPORTING BATTERY STATE IN WFD

(71) Applicant: LG Electronics Inc., Seoul (KR)

(72) Inventors: Giwon Park, Seoul (KR); Dongcheol Kim, Seoul (KR); Byungjoo Lee, Seoul (KR); Jeongyun Jeong, Seoul (KR); Youngjun Jo, Seoul (KR); Mingi Kim, Seoul (KR); Hyunhee Park, Seoul (KR); Taesung Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 381 days.

(21) Appl. No.: 15/541,867

(22) PCT Filed: Jan. 7, 2016

(86) PCT No.: PCT/KR2016/000139
§ 371 (c)(1),
(2) Date: Jul. 6, 2017

(87) PCT Pub. No.: WO2016/111562
PCT Pub. Date: Jul. 14, 2016

(65) Prior Publication Data
US 2018/0017629 A1 Jan. 18, 2018

Related U.S. Application Data

(60) Provisional application No. 62/100,484, filed on Jan. 7, 2015, provisional application No. 62/193,555, filed
(Continued)

(51) Int. Cl.
G01R 31/36 (2020.01)
G01R 31/371 (2019.01)
(Continued)

(52) U.S. Cl.
CPC ....... *G01R 31/3648* (2013.01); *G01R 31/371* (2019.01); *G08C 17/02* (2013.01);
(Continued)

(58) Field of Classification Search
CPC . G01R 31/3648; G01R 31/371; H04L 65/608; G08C 17/02; H04W 88/02
See application file for complete search history.

(56) References Cited

U.S. PATENT DOCUMENTS

2005/0248317 A1 11/2005 Yang
2008/0268917 A1 10/2008 Chang et al.
(Continued)

FOREIGN PATENT DOCUMENTS

KR 1020100002588 1/2010
KR 102013007258 1/2013
KR 1020130096553 8/2013

*Primary Examiner* — Bryan Bui
(74) *Attorney, Agent, or Firm* — Dentons US LLP

(57) ABSTRACT

A method and apparatus for outputting a supplementary content in a WFD is disclosed. A method for outputting a supplementary content in a WFD may comprise the steps of: after a WFD source is connected to a WFD, transmitting, by the WFD source, an RTSP-based RTSP parameter request message to a WFD sink in order to perform a capability negotiation procedure with the WFD sink; transmitting, by the WFD source, an RTSP parameter response message to the WFD sink in response to the RTSP parameter request message; and after the capability negotiation procedure is performed, transmitting, by the WFD source, a transmission stream, obtained by overlapping and multiplexing a video stream including video data having first resolution and a supplementary stream including supplementary data having second resolution, to the WFD sink, wherein a WFD discovery response frame may include second resolution-related information for determining the second resolution and
(Continued)

an RTSP parameter response frame may include the second resolution-related information.

6 Claims, 16 Drawing Sheets

Related U.S. Application Data on Jul. 16, 2015, provisional application No. 62/195,273, filed on Jul. 21, 2015, provisional application No. 62/195,735, filed on Jul. 22, 2015.

(51) Int. Cl.
| | |
|---|---|
| *G08C 17/02* | (2006.01) |
| *H04W 88/02* | (2009.01) |
| *G08C 19/02* | (2006.01) |
| *H04L 29/06* | (2006.01) |
| *H04W 48/16* | (2009.01) |
| *H04W 4/80* | (2018.01) |
| *H04W 80/12* | (2009.01) |
| *H04W 84/12* | (2009.01) |

(52) U.S. Cl.
CPC .......... *G08C 19/02* (2013.01); *H04L 65/4084* (2013.01); *H04L 65/604* (2013.01); *H04L 65/608* (2013.01); *H04W 88/02* (2013.01); *H04W 4/80* (2018.02); *H04W 48/16* (2013.01); *H04W 80/12* (2013.01); *H04W 84/12* (2013.01)

(56) References Cited

U.S. PATENT DOCUMENTS

2012/0252490 A1* 10/2012 Hernacki ........... H04N 21/4524
 455/456.2
2013/0321024 A1* 12/2013 Muller ................... G01R 31/40
 324/764.01

\* cited by examiner

METHOD AND APPARATUS FOR REPORTING BATTERY STATE IN WFD

CROSS-REFERENCE TO RELATED APPLICATIONS

This application is the National Stage filing under 35 U.S.C. 371 of International Application No. PCT/KR2016/000139, filed on Jan. 7, 2016, which claims the benefit of U.S. Provisional Applications No. 62/100,484 filed on Jan. 7, 2015, No. 62/193,555 filed on Jul. 16, 2015, No. 62/195,273 filed on Jul. 21, 2015, and No. 62/195,735 filed on Jul. 22, 2015, the contents of which are all hereby incorporated by reference herein in their entirety.

BACKGROUND OF THE INVENTION

Field of the Invention

The present invention relates to wireless communication and, most particularly, to a method and apparatus for reporting a battery state (or battery status) in a wireless fidelity (Wi-Fi) display (WFD).

Related Art

Although the performance of mobile devices has evolved remarkably to be considered as the equivalent of personal computers (PCs), the mobile device still has its limitations in screen size. Most particularly, since portability is one of the most important features of the mobile device, it marginal line for screen size is said to be equal to 6 inches. However, for users who enjoy viewing multi-media content, a 6-inch display may still be considered to be a small screen.

Accordingly, extensive research is being carried out for developing a technology enabling users to watch images (or video) that were viewed in the mobile device through large-sized television (TV) screens or monitor screens. This technology may also be expressed by using the term wireless display transmission technology. The wireless display transmission technology may be broadly divided into content transmission and mirroring (screen casting). Instead of directly transmitting the display screen of the mobile device as it is, content transmission should be associated with Video on Demand (VOD) services. More specifically, content transmission is a method of sending images (or video) via signal, and mirroring is a method of sending a content filed to a remote device via streaming in order to show (or display) the same content once again through a large-sized screen, such as a TV screen.

Just as implied in the term itself, mirroring (screen casting) corresponds to a method of simultaneously showing a screen that is displayed on a mobile device as though it is reflected on a mirror. This is similar to a method of projecting a computer screen through a projector, when performing a presentation by establishing a wired connection, such as D-Subminiature (D-sub) (RGB), Digital Visual Interface (DVI), High-Definition Multimedia Interface (HDMI). The mirroring method is advantageous in that it can wirelessly transmit pixel information of an original screen without modification in real-time without being dependent on a specific service.

WiFi Miracast is being researched as a wireless display transmission technology using Wi-Fi. Miracast is a wireless image (or video) transmission standard as well as a wireless display transmission technology. Miracast is a type of mirroring (screen casting) technology, wherein the display screen and sound are compressed and outputted to a wireless LAN and then the compressed display screen and sound are decompressed in a dongle or an all-in-one receiver, thereby being displayed on the screen.

SUMMARY OF THE INVENTION

Technical Objects

An object of the present invention is to provide a method for reporting a battery state in a WFD.

Another object of the present invention is to provide an apparatus for reporting a battery state in a WFD.

Technical Solutions

In order to achieve the above-described technical object of the present invention, according to an aspect of the present invention, a method for reporting a battery status in a Wi-Fi display (WFD) may include the steps of determining, by a first WFD device, at least one available discovery mechanism based on a battery level indicator bitmap and a battery level threshold value, selecting, by the first WFD device, one discovery mechanism among the at least one available discovery mechanism, and discovering, by the first WFD device, a service or a second WFD device based on the selected one discovery mechanism, wherein the battery level indicator bitmap may include information on a remaining battery amount that remains in the first WFD device, and wherein the battery level threshold value may correspond to a threshold value for determining the at least one available discovery mechanism.

In order to achieve the above-described technical object of the present invention, according to another aspect of the present invention, a first Wi-Fi display (WFD) device reporting battery status may include a radio frequency (RF) unit transmitting or receiving radio signals, and a processor being operatively connected to the RF unit, wherein the processor may be configured to determine at least one available discovery mechanism based on a battery level indicator bitmap and a battery level threshold value, to select one discovery mechanism among the at least one available discovery mechanism, and to discover a service or a second WFD device based on the selected one discovery mechanism, wherein the battery level indicator bitmap may include information on a remaining battery amount that remains in the first WFD device, and wherein the battery level threshold value may correspond to a threshold value for determining the at least one available discovery mechanism.

Effects of the Invention

A communication module of the WFD device may be determined based on a battery state (or battery status) of the WFD device, and by having a WFD source and a WFD sink exchange battery status information between one another and operate in a power save mode, power may be saved.

DESCRIPTION OF EXEMPLARY EMBODIMENTS

In the conventional wireless LAN system, operations between devices (access point (AP) and station (STA)) within an infrastructure basic service set (BSS), wherein the access point (AP) functions as a hub, were mostly defined. The AP may perform a function of supporting a physical layer for a wireless/wired connection, a routing function for devices within the network, a function of adding/removing devices to/from the network, a function of providing services, and so on. More specifically, in the conventional wireless LAN system, devices within the network are connected through the AP and not connected to one another by direct connection.

As a technology for supporting direct connection between devices, a Wi-Fi Direct standard is being defined. Wi-Fi Direct is a direct communication technology allowing devices (or stations (STAs)) to be easily connected to one another without an access point, which is essentially required in the conventional wireless LAN system. In case Wi-Fi Direct is being used, connection between the devices is configured without any complicated configuration (or set-up) procedures. Thus, diverse services may be provided to the user.

In the Wi-Fi Alliance (WFA), a Wi-Fi Direct service (WFDS), which supports diverse services using a Wi-Fi Direct link (e.g., Send, Play, Display, Print, and so on), is being researched. According to the WFDS, an application may be controlled or managed by a service platform, which is referred to as an Application Service Platform (ASP).

A WFDS device supporting a WFDS includes devices supporting a wireless LAN system, such as display devices, printers, digital cameras, projectors, smart phones, and so on. Also, the WFDS device may include an STA and an AP. WFDS devices within a WFDS network may be directly connected to one another.

Figure 1:
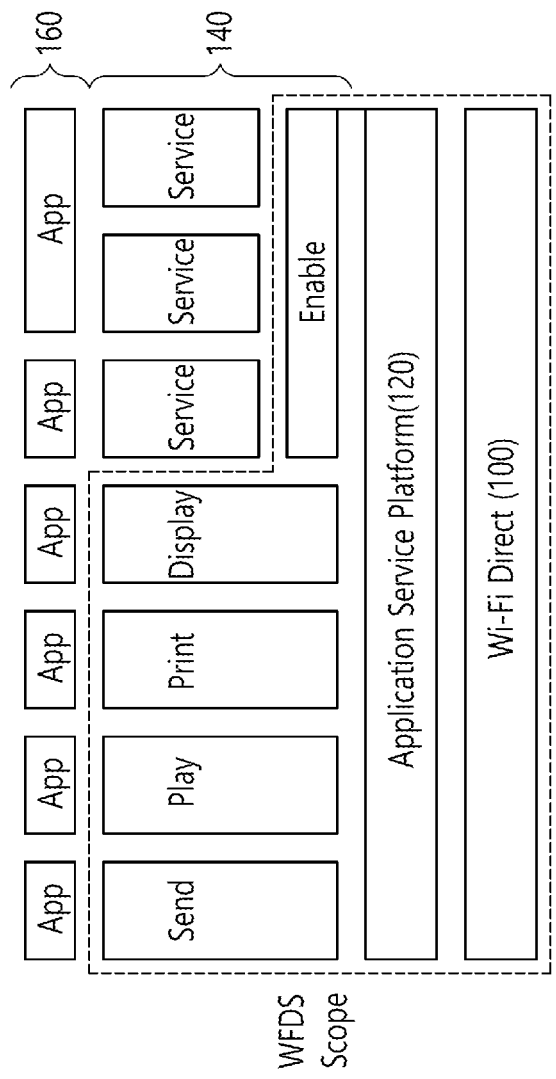
FIG. 1 is a conceptual view illustrating Wi-Fi Direct Service (WFDS) configuration elements (or components).

FIG. 1 is a conceptual view illustrating Wi-Fi Direct Service (WFDS) configuration elements (or components).

Referring to FIG. 1, a WFDS framework may include a Wi-Fi Direct layer 100, an ASP 120, a service layer 140, and an application layer 160.

The Wi-Fi Direct layer 100 corresponds to a medium access control (MAC) layer, which is defined in the Wi-Fi Direct standard. A wireless connection may be configured by a physical layer (not shown), which is backward compatible with a Wi-Fi PHY, below the Wi-Fi Direct layer 100. An Application Service Platform (ASP) 120 is defined above the Wi-Fi Direct layer 100.

The ASP 120 corresponds to a common shared platform, and the ASP 120 performs the functions of session management, service command processing, and control and security between ASPs between the Application layer 160, which is a higher layer of the ASP 120, and the Wi-Fi Direct layer 100, which is a lower layer of the ASP 120.

The Service layer 140 is defined above the ASP 120. For example, the Service layer 140 may support 4 basic service, which correspond to Send, Play, Display, and Print services, and a service that is defined in a third-party application. Moreover, the Service layer 140 may also support Wi-Fi Serial Bus (WSB), Wi-Fi Docking, or Neighbor Awareness Networking (NAN).

The application layer 160 may provide a user interface (UI), and the application layer 160 may also express information in a format that can be recognized by human beings and may deliver (or transport) user input to a lower layer.

Hereinafter, the exemplary embodiment of the present invention will disclose a wireless fidelity (Wi-Fi) display (WFD) among the WFDS in more detail.

The WFD standard was defined for performing transmission of audio/video (AV) data between devices while satisfying high quality and low latency. Wi-Fi devices may be connected to one another by using a peer-to-peer method through a WFD network (WFD session) to which the WFD standard is applied without passing through a home network, an office network, or a hotspot network. Hereinafter, a device that transmits and receives data in accordance with the WFD standard may be expressed by using the term WFD device. The WFD devices within the WRD network may discover information on the WFD devices (e.g., capability information) corresponding to one another. And, then, after configuring (or setting up) the WFD session, the WFD devices may perform rendering on the contents through the WFD session.

A WFD session may correspond to a network between a source device, which provides contents, and a sink device, which receives and performs rendering of the contents. The source device may also be expressed by using the term WFD source, and the sink device may also be expressed by using the term WFD sink. The WFD source may perform mirroring of the data existing in the display (or screen) of the WFD source to the display of the WFD sink.

The WFD source and the WFD sink may exchange a first sequence message between one another and may then perform device discovery and service discovery procedures. After completing the device discovery and service discovery procedures between the WFD source and the WFD sink, an internet protocol (IP) address may be allocated to each of the WFD source and the WFD sink. A transmission control protocol (TCP) connection may be established between the WFD source and the WFD sink, and, afterwards, real-time streaming protocol (RTSP) and real-time protocol (RTP) stacks corresponding to the WFD source and the WFD sink may be activated.

A capability negotiation procedure between the WFD source and the WFD sink may be performed through the RTSP, and, while the capability negotiation procedure is being carried out, the WFD source and the WFD sink may exchange RTSP-based messages (message (M) 1 to M4). Thereafter, the WFD source and the WFD sink may exchange WFD session control messages. Also, a data session may be established between the WFD source and the WFD sink through the RTP. In the WFD network, a User Datagram Protocol (UDP) may be used for data transport.

Figure 2:
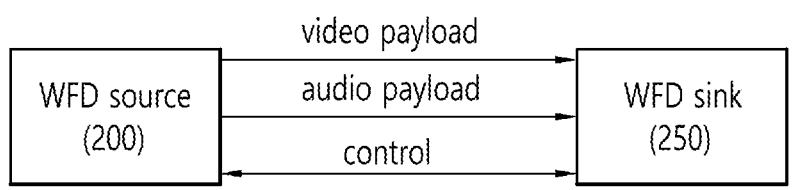
FIG. 2 is a conceptual view illustrating a WFD network.

FIG. 2 is a conceptual view illustrating a WFD network.

Referring to FIG. 2, as WFD devices, a WFD source 200 and a WFD sink 250 may be connected to one another based on WiFi-P2P.

Herein, the WFD source 200 may refer to a device supporting streaming of multimedia contents through a WiFi peer to peer (P2P) link, and the WFD sink 250 may refer to a device performing procedures of receiving multimedia contents from the WFD source 200 through the P2P link and generating image and/or sound. The procedure of generating image and/or sound may also be expressed by using the term rendering.

The WFD sink 250 may be divided into a primary sink and a secondary sink. Most particularly, when independently connected to the WFD source 200, the secondary sink may perform rendering only on an audio payload.

Figure 3:
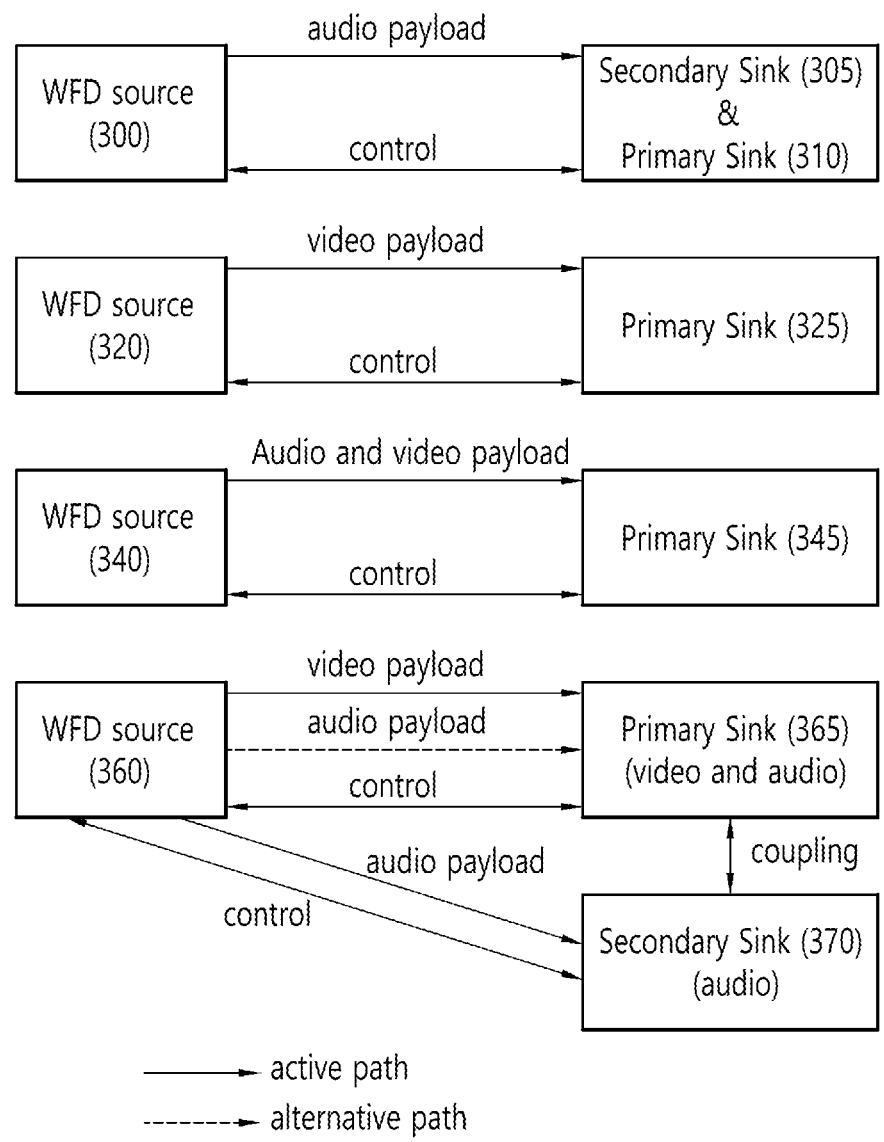
FIG. 3 is a conceptual view illustrating a WFD session.

FIG. 3 is a conceptual view illustrating a WFD session.

The first part starting from the top of FIG. 3 corresponds to an audio-only session. A WFD source 300 may be connected to any one of a primary sink 305 and a secondary sink 310 through the audio-only session.

The second part starting from the top of FIG. 3 corresponds to a video-only session. A WFD source 320 may be connected to a primary sink 325.

The third part starting from the top of FIG. 3 corresponds to an audio and video session, and, just as in the video-only session, a WFD source 340 may be connected to a primary sink 345.

The fourth part starting from the top of FIG. 3 discloses a session connection in a Coupled WFD Sink operation. In the Coupled Sink WFD operation, the primary sink 365 may perform video rendering, and the secondary sink 370 may perform audio rendering. Alternatively, the primary sink 365 may perform both video rendering and audio rendering.

The above-described WFD sessions may be established after performing the procedures described below in FIG. 4.

Figure 4:
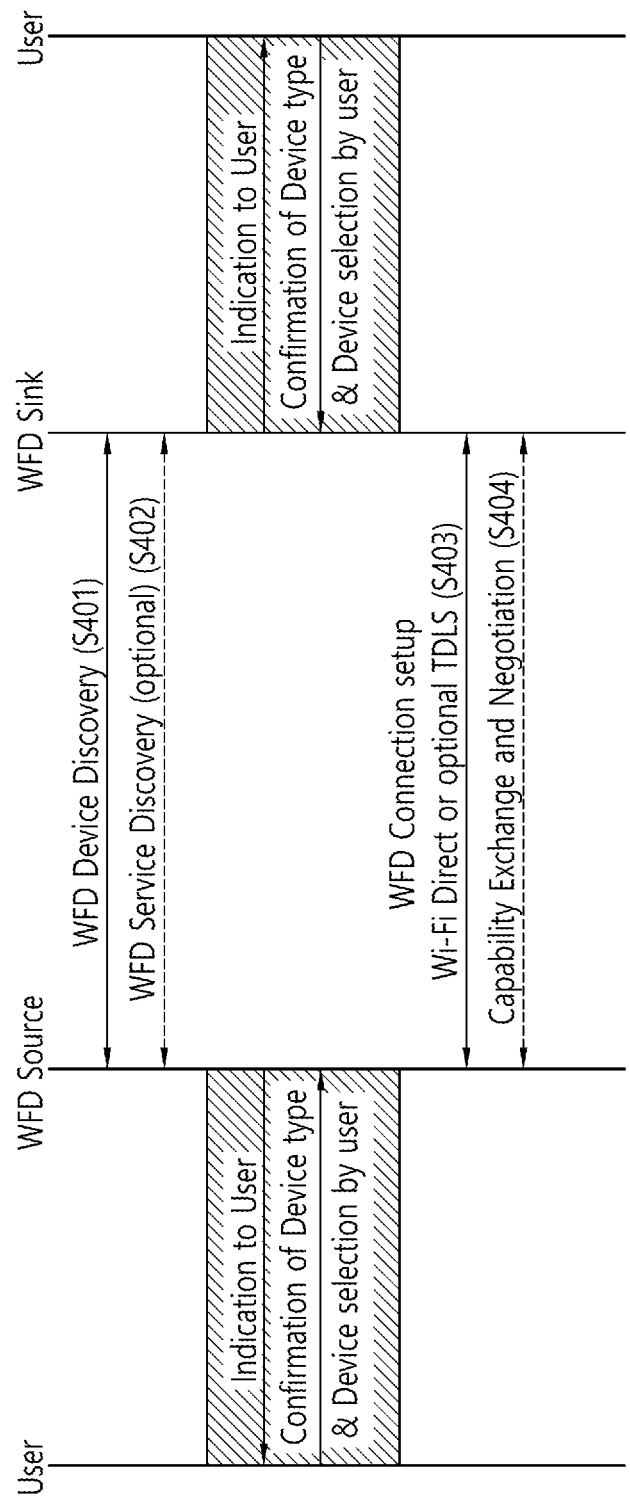
FIG. 4 is a conceptual view illustrating a WFD session configuration method.

FIG. 4 is a conceptual view illustrating a WFD session configuration method.

Referring to FIG. 4, the WFD session may be set up (or configured) after performing WFD Device Discovery S401, WFD Service Discovery S402, WFD Connection Setup S403, and Capability Exchange and Negotiation S404 procedures.

More specifically, in the procedure of WFD Device Discovery S401, the WFD source may discover a peer device for WFD, i.e., WFD sink by performing the WFD Device Discovery procedure.

A beacon frame, a probe request frame, and a probe response frame, which are transmitted by the WFD source and the WFD sink for the WFD Device Discovery, may include WFD Information Element (IE). Herein, WFD IE may correspond to an information element including information related to the WFD, such as device type, device status, and so on.

The WFD source may transmit a probe request frame including a WFD IE to the WFD sink, and the WFD sink may transmit a probe response frame including a WFD IE as a response to the probe request frame. In case the WFD device is associated with an infrastructure AP and operates as a Wi-Fi P2P device, a WFD IE and a P2P information element may be included in the probe request frame. The probe response frame, which is transmitted as a response to the probe request frame, may be transmitted through the channel through which the probe request frame was received and may include both the P2P IE and the WFD IE.

Details related to the WFD Device Discovery procedure that are not mentioned in this description may follow related documents, such as 'Wi-Fi Display Technical Specification' and/or 'Wi-Fi Peer-to-Peer (P2P) Technical Specification Wi-Fi Direct Service Addendum', and this may also be applied to the descriptions that follow.

In the procedure of WFD Service Discovery S402, a discovery procedure corresponding to service capability between the WFD source and the WFD sink, which have performed WFD Device Discovery, may be performed. For example, if the WFD source transmits a service discovery request frame, which includes information on WFD capability, the WFD sink may transmit a service discovery response frame, which includes information on the WFD capability, as a response to the service discovery request frame. The WFD service discovery procedure may correspond to an optional procedure.

In order to perform the WFD service discovery procedure, the probe request frame and the probe response frame, which are used in the WFD device discovery procedure, may include information indicating whether or not the WFD device is equipped with the capability supporting the service discovery procedure.

In the procedure of WFD Connection Setup S403, the WFD device, which has performed the WFD device discovery procedure, and which has optionally performed the WFD service discovery procedure, may select a WFD device for performing WFD connection setup. After the WFD device is selected for the WFD connection setup in accordance with the policy or user input, and so on, any one of the connectivity schemes between Wi-Fi P2P and tunneled direct link service (TDLS) may be used for WFD connection. The WFD devices may determine a connection method based on an associated basic service set identifier (BSSID) subelement, which is transported along with preferred connectivity information and WFD information elements.

Figure 5:
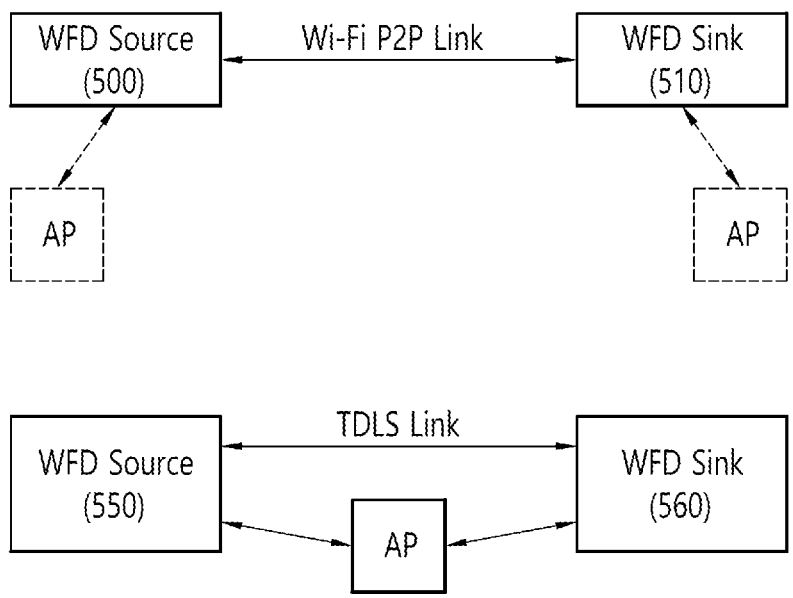
FIG. 5 is a conceptual view illustrating a network between a WFD source and a WFD sink.

FIG. 5 is a conceptual view illustrating a network between a WFD source and a WFD sink.

An upper part of FIG. 5 discloses a connection between a WFD source 500 and a WFD sink 510 that is based on Wi-Fi P2P, and a lower part of FIG. 5 discloses a connection between a WFD source 550 and a WFD sink 560 that is based on a TDLS link.

As shown in the upper part of FIG. 5, the AP may be common to both the WFD source 500 and the WFD sink 510, or the AP may be different for each of the WFD source 500 and the WFD sink 510. Alternatively, the AP may not exist. As shown in the lower part of FIG. 5, in case WFD connection is performed by using a TDLS link, the WFD source 550 and the WFD sink 560 shall maintain connection with the same AP.

The WFD capability exchange and negotiation procedure may be performed after performing the WFD connection setup procedure between the WFD devices. By performing the WFD capability exchange and negotiation procedure, the WFD source and the WFD sink may exchange at least one set of information on the codec supported by each of the WFD source and the WFD sink, profile information of the codec, level information of the codec, and resolution information. The WFD capability exchange and negotiation procedure may be performed by exchanging messages using a Real Time Streaming Protocol (RTSP). Also, a parameter set defining audio/video payload during a WFD session may be determined. The WFD capability exchange and negotiation procedure may be performed by exchanging messages starting from RTSP M1 to RTSP M4, as shown in FIG. 6.

The WFD session establishment procedure may be performed after the WFD exchange and negotiation procedure.

Figure 6:
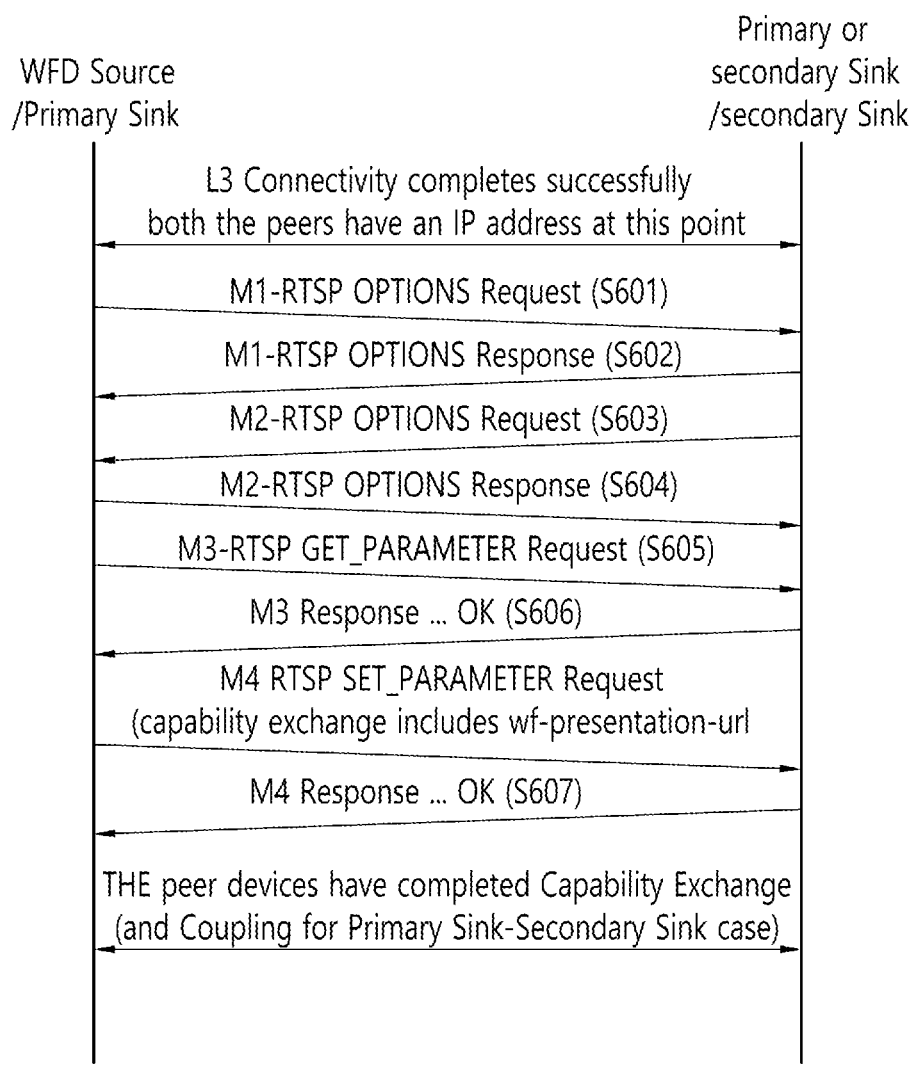
FIG. 6 is a conceptual view illustrating WFD capability exchange and negotiation procedures.

FIG. 6 is a conceptual view illustrating WFD capability exchange and negotiation procedures.

Referring to FIG. 6, the WFD source may transmit a RTSP M1 request message for initiating a RSTP procedure and WFD capability negotiation (step S601).

The RTSP M1 request message may include a RTSP OPTIONS request for determining a RTSP method set, which is supported by the WFD sink. The WFD sink that has received the RTSP M1 request message may transmit a RTSP M1 response message including a list of RTSP methods, which are supported by the WFD sink (step S602).

Subsequently, the WFD sink may transmit a RTSP M2 request message for determining a RTSP method set, which is supported by the WFD source (step S603).

When the RTSP M2 request message is received, the WFD source may respond to the request message by transmitting a RTSP M2 response message including a list of RTSP methods, which are supported by the WFD source (step S604).

The WFD source may transmit a RTSP M3 request message (RTSP GET_PARAMETER request message) specifying a list of WFD capabilities that the WFD source wishes to know (step S605).

When the RTSP M3 request message is received, the WFD sink may respond to the request message by transmitting a RTSP M3 response message (RTSP GET_PARAMETER response message) (step S606).

Based on the RTSP M3 response message, the WFD source may determine an optimal parameter set that is to be used during a WFD session, and, then, the WFD source may transmit a RTSP M4 request message (RTSP SET_PARAMETER request message), which includes the determined parameter set, to the WFD sink.

The WFD sink that has received the RTSP M4 request message may transmit a RTSP M4 response message (RTSP SET_PARAMETER response message) (step S607).

Figure 7:
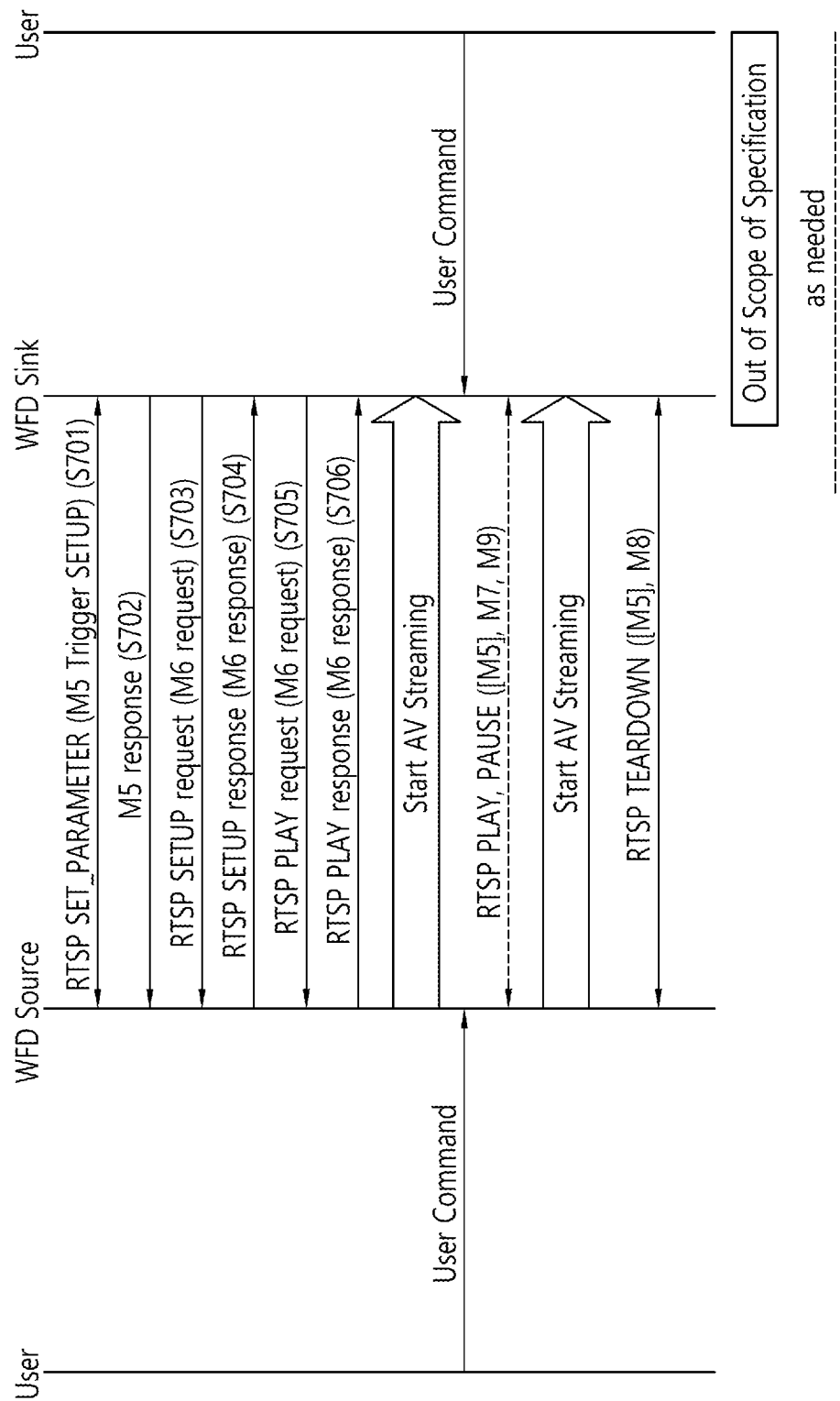
FIG. 7 is a conceptual view illustrating a WFD session establishment procedure.

FIG. 7 is a conceptual view illustrating a WFD session establishment procedure.

In FIG. 7, the WFD sources/WFD sinks that have performed WFD capability exchange and negotiation may establish a WFD session. More specifically, the WFD source may transmit a RTSP SET parameter request message (RTSP M5 Trigger SETUP request) to the WFD sink S701.

The WFD sink may transmit a RTSP M5 response message as a response to the RTSP SET parameter request message (step S702).

If the RTSP M5 message including the trigger parameter SETUP is successfully exchanged, the WFD sink may transmit a RTSP SETUP request message (RTSP M6 request) to the WFD source (step S703).

If the RTSP M6 request message is received, the WFD source may respond to the request message by transmitting a RTSP SETUP response message (RTSP M6 response) (step S704).

A successful establishment of a RTSP session may be indicated by setting up a status code of the RTSP M6 response message.

After a successful exchange of the RTSP M6 message, the WFD sink may transmit a RTSP M7 request message to the source device in order to notify that the WFD sink is ready to receive RTP streams (step S705), and the WFD source may respond to the request message by transmitting a RTSP PLAY response message (RTSP M7 response message) (step S706). A successful establishment of a WFD session may be indicated based on the status code of a RTSP PLAY response message.

After a WFD session is established, the WFD source may transmit a RTSP M3 request message (RTSP GET_PARAMETER request message) for acquiring capability corresponding to at least one RTSP parameter that is supported by the WFD sink, a RTSP M4 request message for setting up at least one RTSP parameter value in order to perform capability re-negotiation between the WFD source and WFD sink for updating an Audio/Video (AV) format, a RTSP M5 request message triggering the WFD sink to transmit a RTSP PAUSE request message (RTSP M9 request message), a RTSP M12 request message indicating that the WFD source has entered a WFD standby mode, a RTSP M14 request message for selecting input type, input device, and other parameters that are to be used in a user input back channel (UIBC), or a RTSP M15 request message for enabling or disabling a user input back channel (UIBC), and so on, to the WFD sink. The WFD sink that has received the above-described RTSP request messages from the WFD source may respond to the received request messages by transmitting RTSP response messages.

Subsequently, the WFD sink may transmit a RTSP M7 request message (RTSP PLAY request message for initiating (or resuming) audio/video streaming, a RTSP M9 request message (RTSP PAUSE request message) for temporarily interrupting audio/video streaming that is being transmitted from the WFD source to the WFD sink, a RTSP M10 request message for requesting the WFD source to change the audio rending device, a RTSP M11 request message indicating a change in an active connector type, a RTSP M12 request message indicating that the WFD sink has entered the WFD standby mode, a M13 request message requesting the WFD source to refresh an instantaneous decoding refresh (IDR), a RTSP M14 request message for selecting input type, input device, and other parameters that are to be used in a UIBC, or a RTSP M15 request message for enabling or disabling a UIBC, and so on, to the WFD source. The WFD source that has received the RTSP request messages, which are listed above, may respond to the received request messages by transmitting RTSP response messages.

Once the WFD session is established and audio/video streaming is initiated, the WFD source and the WFD sink may carry out audio/video streaming by using a codec that is commonly supported by both the WFD source and the WFD sink. By using the codec that is commonly supported by both the WFD source and the WFD sink, interoperability between the WFD source and the WFD sink may be ensured.

WFD communication is based on a WFD IE, and a format of the WFD IE may be defined as shown below in Table 1.

TABLE 1

| Field | Size (octets) | Value (Hexa-decimal) | Description |
|---|---|---|---|
| Element ID | 1 | DD | IEEE 802.11 vendor specific usage |
| Length | 1 | Variable | Length of the following fields in the IE in octets. The length field is variable and set to 4 plus the total length of WFD subelements. |
| OUI | 3 | 50-6F-9A | WFA Specific OUI |
| OUI Type | 1 | 0A | Identifying the type or version of the WFD IE. Setting to 0x0A indicates WFA WFD v1.0 |
| WFD subelements | Variable | | One or more WFD subelements appear in the WFD IE |

The format is configured of an element ID field, a Length field, a WFD-specific OUI field, a OUI type field indicating a type/version of the WFD IE, and a WFD subelement field. The WFD subelement field is configured to have a format that is shown below in Table 2.

TABLE 2

| Field | Size (octets) | Value (Hexadecimal) | Description |
|---|---|---|---|
| Subelement ID | 1 | | Identifying the type of WFD subelement. The specific value is defined in Table 5-3. |
| Length | 2 | Variable | Length of the following fields in the subelement |
| Subelements body field | Variable | | Subelement specific information fields |

The subelement ID field may be defined as shown below in Table 3.

TABLE 3

| Subelement ID(Decimal) | Notes |
|---|---|
| 0 | WFD Device Information |
| 1 | Associated BSSID |
| 2 | WFD Audio Formats |
| 3 | WFD Video Formats |
| 4 | WFD 3D Video Formats |
| 5 | WFD Content Protection |
| 6 | Coupled Sink Information |
| 7 | WFD Extended Capability |
| 8 | Local IP Address |
| 9 | WFD Session Information |
| 10 | Alternative MAC Address |
| 11-255 | Reserved |

Referring to Table 3, the 1-octet subelement ID field may indicate which type of information is included in the WFD subelement. More specifically, the values 0, 1, ..., 10 of the subelement ID field may respectively indicate that each of the subelements corresponds to a WFD Device Information subelement, an Associated BSSID subelement, a WFD Audio Formats subelement, a WFD Video Formats subelement, a WFD 3D Video Formats subelement, a WFD Content Protection subelement, a Coupled Sink Information subelement, a WFD Extended Capability subelement, a Local IP Address subelement, a WFD Session Information subelement, and an Alternative MAC Address subelement. Herein, the WFD Device Information subelement may include information that is required for determining whether or not to attempt pairing with a WFD device and session generation. The Associated BSSID subelement may be used for indicating the address of the currently associated AP. Each of the WFD Audio Formats subelement, the WFD Video Formats subelement, and the WFD 3D Video Formats subelement may be used to respectively indicate capabilities of the WFD device related to audio, video, and 3D video. The WFD Content Protection subelement transports information related to a content protection method, and the Coupled Sink Information subelement may deliver information related to the status of the coupled sink, the MAC address, and so on. The WFD Extended Capability subelement may be used for transporting diverse capability information of other WFD devices, and the Local IP Address subelement may be used for transporting an IP address to a WFD peer during a TDLS setup procedure. The WFD Session Information subelement may include information corresponding to a list information technicians of WFD device information within a WFD group. In case the WFD connection method requires an interface (e.g., MAC address) that is different from the interface used in the device discovery procedure, the Alternative MAC Address subelement may transport the related information.

Figure 8:
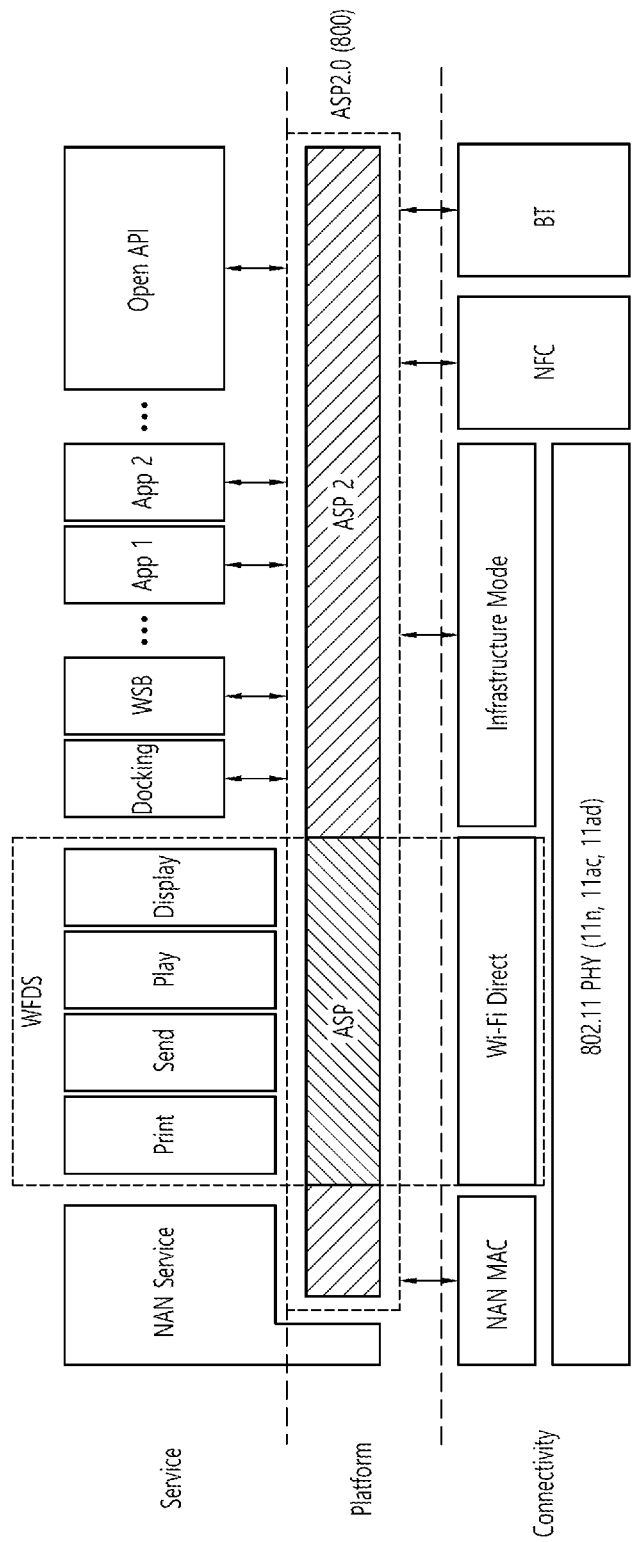
FIG. 8 is a conceptual view illustrating operations of an application service platform (ASP).

FIG. 8 is a conceptual view illustrating operations of an application service platform (ASP).

Referring to FIG. 8, disclosed herein a method of a WFD device for determining a service discovery mechanism and connection type based on an ASP2 800 and using a wanted service.

The ASP2 800 may correspond to a logical entity configured to perform general functions that are required by general function play, send, display, and print services.

Referring to FIG. 8, the ASP2 800 may determine a Discovery mechanism (or Discovery method) that is used for seeking a service.

For example, the ASP2 800 may perform a series of procedures starting from seeking a device/service based on at least one Discovery (or (seek) method among peer to peer (P2P), Neighbor Awareness Networking (NAN), near field communication (NFC), Bluetooth low energy (LE), and Wi-Fi Infrastructure (existing connection), and up to using services, such as Session Establishment and Session Connection, and so on, of the discovered device/service.

In the present invention, based on information on a remaining battery amount, the WFD device may determine which one of the above-described Discovery mechanisms is to be used for selecting (or discovering) a device (another WFD device)/service through the ASP2 800.

The present invention discloses a method of the ASP2 800 for selecting a Discovery mechanism for discovering (or seeking) a device/service.

Hereinafter, the ASP may be used in a meaning that includes ASP 2.0. Furthermore, a WFD2 source may be interpreted as the WFD source, and a WFD2 sink may be interpreted as the WFD sink.

Figure 9:
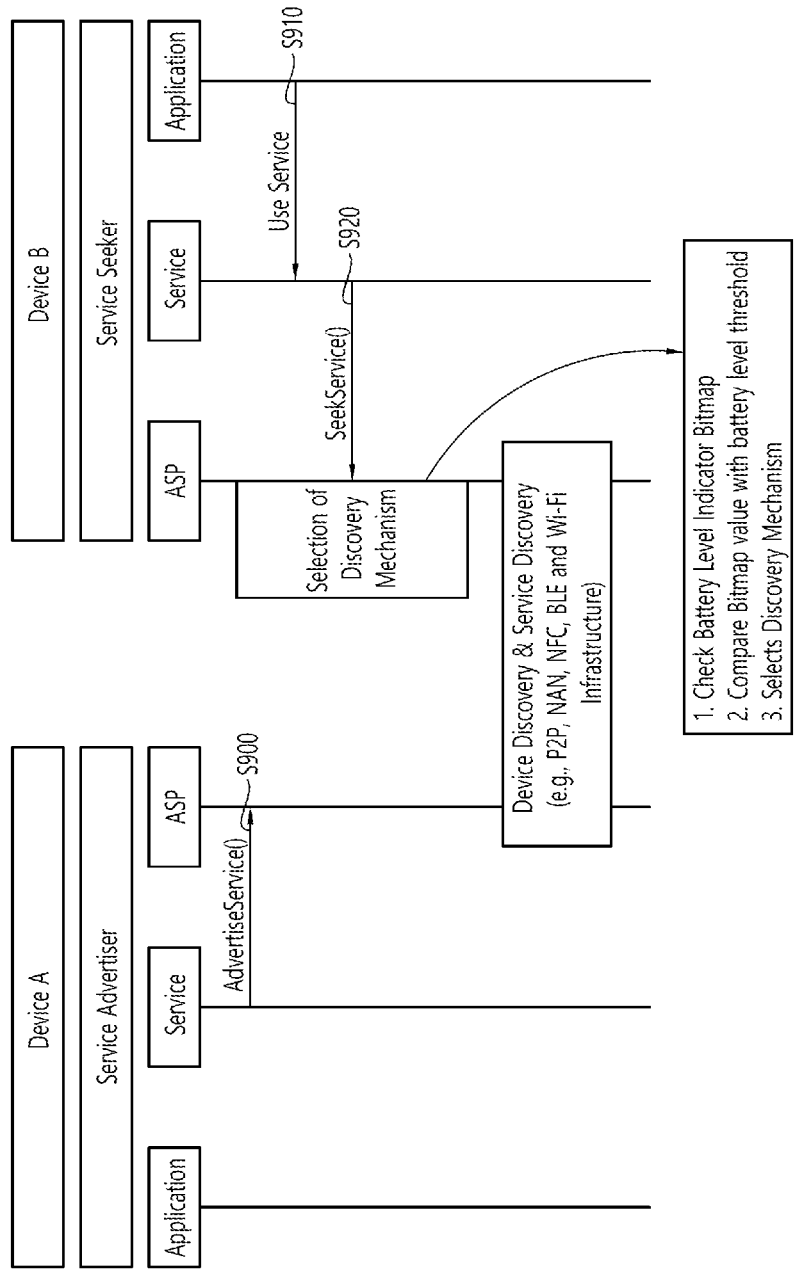
FIG. 9 is a conceptual view illustrating an ASP session establishment method according to an exemplary embodiment of the present invention.

FIG. 9 is a conceptual view illustrating an ASP session establishment method according to an exemplary embodiment of the present invention.

FIG. 9 discloses a device discovery and service Discovery mechanism between device A (or WFD device A) and device B (or WFD device B). Hereinafter, the WFD device may also be interpreted as a WFD source, a WFD sink, a user equipment, a station (STA), and so on.

Referring to FIG. 9, the WFD device A may perform advertisement on a service based on AdvertiseService( ), which is delivered to an ASP entity through a service entity (step S900), and the WFD device B may request for usage of the service (Use Service) from an application entity to a service entity (step S910) and may request for the discovery (or seeking) of a service (SeekService( )) to the ASP entity based on the service entity (step S920).

The ASP entity selects a discovery mechanism (or method) from a plurality of discovery mechanisms (e.g., P2P, NAN, NFC, Bluetooth low energy (LE), WiFi-Infrastructure).

In order to select a Discovery mechanism, the ASP checks a battery level indication bitmap and compares the value of the battery level indication bitmap with a battery level threshold value and then selects the Discovery mechanism.

The WFD device may maintain the battery level indication bitmap as described below in accordance with the remaining battery amount of the WFD device. When the SeekService( ) method is called (or summoned) from the service entity to the ASP entity, the ASP2 may select a Discovery mechanism based on the battery level indication bitmap, which is stored in the ASP2.

In the present invention, a battery level threshold value is also defined, and this may be used with the battery level indication bitmap value, which is stored in the device, in order to select the Discovery mechanism.

For example, the ASP entity may select the Discovery mechanism of the WFD device in accordance with the battery level threshold value, which is described below. Hereinafter, an order of power consumption in the Discovery mechanism may be assumed in the exemplary embodiment of the present invention, as described below. Among the Discovery mechanisms of the WFD device, starting from the method having the lowest power consumption level, the order of the Discovery mechanisms may correspond to Bluetooth LE, NFC, NAN, Wi-Fi infrastructure, and P2P.

(1) Battery Level Indicator<Battery Threshold Value (20%)

The WFD device may select Bluetooth LE as the Discovery mechanism and may perform the Discovery procedure based on Bluetooth LE.

If the Bluetooth LE function (or Bluetooth LE module) of the WFD device is in an Off state, and in case the battery level condition is satisfied, the Bluetooth LE function may be automatically shifted to the On state in the ASP, and the discovery of another WFD device/service may be performed through the Bluetooth LE.

(2) Battery Threshold Value (20%)<Battery Level Indicator<Battery Threshold Value (30%)

The WFD device may select one of NFC and Bluetooth LE as the Discovery mechanism.

If the function of the Discovery mechanism (e.g., NFC, Bluetooth LE), which is selected by the WFD device, is in an Off state, and in case the above-described battery level condition is satisfied, the function of the selected Discovery mechanism (NFC or Bluetooth LE) may be automatically shifted to the On state by the ASP, and the discovery of another WFD device and service may be performed through the NFC or Bluetooth LE.

(3) Battery Threshold Value (30%)<Battery Level Indicator)<Battery Threshold Value (50%)

The WFD device may select one of NAN, NFC and Bluetooth LE as the Discovery mechanism.

If the function of the Discovery mechanism (e.g., NAN, NFC, or Bluetooth LE), which is selected by the WFD device, is shifted to an Off state, and in case the corresponding battery level condition is satisfied, the ASP may automatically shift the function of the selected Discovery mechanism (NAN, NFC or Bluetooth LE) to the On state and may perform the discovery of another WFD device and service through the NAN, NFC or Bluetooth LE.

(4) Battery Level Indicator>Battery Threshold Value (50%)

The WFD device may select one of P2P, NAN, NFC, Bluetooth LE, and Wi-Fi Infrastructure as the Discovery mechanism. If the function of the Discovery mechanism selected by the WFD device is in an Off state, the WFD device may automatically shift the function of the selected Discovery mechanism to the On state and may perform the discovery of another WFD device and service through the selected Discovery mechanism (P2P, NAN, NFC, Bluetooth LE, or Wi-Fi Infrastructure).

The above-described exemplary embodiment of the present invention is merely an example. And, therefore, the ASP entity may select the Discovery mechanism based on diverse ratio values between the battery level indicator bitmap value and the battery level threshold value.

Table 4 shown below indicates the battery level indicator.

TABLE 4

| Bits | Index | Interpretation (indicates remaining Battery amount) |
|---|---|---|
| 0 | 0 | 10% or less |
| 1 | 1 | 20% or less |
| 2 | 2 | 30% or less |
| 3 | 3 | 40% or less |
| 4 | 4 | 50% or less |
| 5 | 5 | 60% or less |
| 6 | 6 | 70% or less |
| 7 | 7 | 80% or less |
| 8 | 8 | 90% or less |
| 9 | 9 | 90% or more~less than 100% |
| 10 | 10 | 100% (Full Charged Status) |
| 11~15 | 11~15 | Reserved |

Referring to Table 4, the battery level indicator bitmap may be configured of 16 bits, and, with the exception for the twelfth ($12^{th}$) bit and the fifteenth ($15^{th}$) bit, each of the first ($1^{th}$) bit to the eleventh ($11^{th}$) bit. Each bit may correspond to information on the remaining battery amount. Each of the 16 bits may be respectively indexed from 0 to 15.

In case the first bit (Index 0) corresponds to 1 bit, this may indicate that the remaining battery amount of the WFD device is 10% or less. In case the second bit (Index 1) corresponds to 1 bit, this may indicate that the remaining battery amount of the WFD device is 20% or less. In case the third bit (Index 2) corresponds to 1 bit, this may indicate that the remaining battery amount of the WFD device is more than 20% and equal to 30% or less. In case the fourth bit (Index 3) corresponds to 1 bit, this may indicate that the remaining battery amount of the WFD device is more than 30% and equal to 40% or less. In case the fifth bit (Index 4) corresponds to 1 bit, this may indicate that the remaining battery amount of the WFD device is more than 40% and equal to 50% or less. In case the sixth bit (Index 5) corresponds to 1 bit, this may indicate that the remaining battery amount of the WFD device is more than 50% and equal to 60% or less. In case the seventh bit (Index 6) corresponds to 1 bit, this may indicate that the remaining battery amount of the WFD device is more than 60% and equal to 70% or less. In case the eighth bit (Index 7) corresponds to 1 bit, this may indicate that the remaining battery amount of the WFD device is more than 70% and equal to 80% or less. In case the ninth bit (Index 8) corresponds to 1 bit, this may indicate that the remaining battery amount of the WFD device is more than 80% and equal to 90% or less. In case the tenth bit (Index 9) corresponds to 1 bit, this may indicate that the remaining battery amount of the WFD device is more than 90% and equal to 100% or less.

Figure 10:
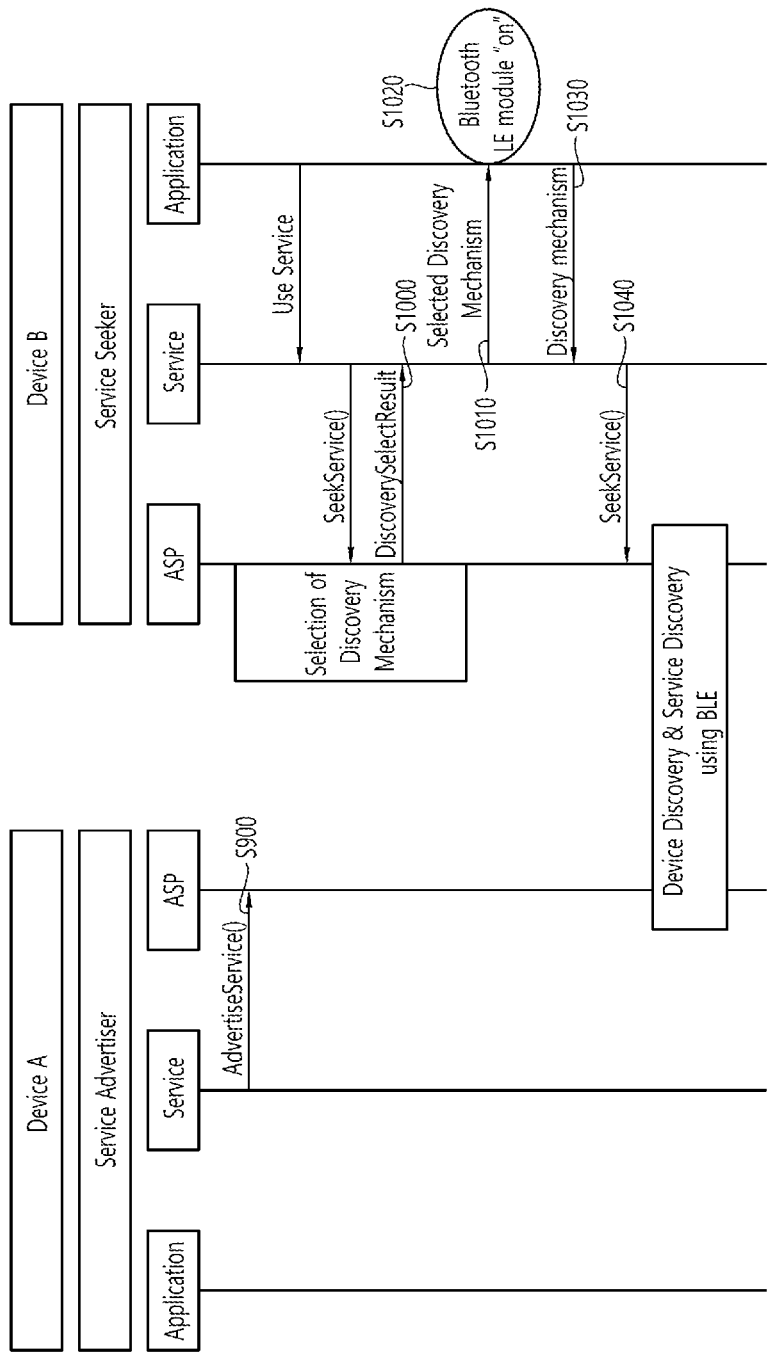
FIG. 10 illustrates a Discovery mechanism that is based on an ASP entity according to an exemplary embodiment of the present invention.

FIG. 10 illustrates a Discovery mechanism that is based on an ASP entity according to an exemplary embodiment of the present invention.

FIG. 10 discloses the selection of a Discovery mechanism based on an ASP entity, which is proposed in the present invention. The above-described exemplary embodiment of the present invention discloses a method of the WFD device for activating the Discovery module (or a method for shifting to an On state).

Referring to FIG. 10, the ASP entity may select Bluetooth LE as the Discovery mechanism based on the battery level indicator bitmap and the battery level threshold value. In the WFD device, in case the Bluetooth LE module is in an Off state, the discovery of a service/another WFD cannot be performed via Bluetooth LE.

Therefore, according to the exemplary embodiment of the present invention, in case the discovery module that is selected by the ASP entity is deactivated (or is an inactive state), the discovery module may be required to be activated.

If the ASP entity has selected Bluetooth LE as the Discovery mechanism, and in case the Bluetooth LE module of the WFD device is in an Off state, the ASP entity may deliver (or transport) an event that is referred to as a Discovery Select Result (DiscoverySelectResult) to a service end (S1000). The DiscoverySelectResult event may include information on the Discovery module that is discovered by the WFD device.

The service entity, which has received the DiscoverySelectResult event, may deliver information on the Selected Discovery Mechanism to the application end (S1010).

The application entity, which has received the information on the Discovery mechanism (e.g., Bluetooth LE) from the service entity, may activate the discovery module (S1020).

The application entity may transmit information on the discovery mechanism to the service entity (S1030), and the service entity may call (or summon) the SeekService( ) method and may then perform discovery on another WFD device/service based on the Bluetooth LE (S1040).

FIG. 10 corresponds to an exemplary embodiment using Bluetooth LE. Even in a case when another communication module, such as NFC, NAN, Wi-Fi, and so on, is in an Off state, the communication module may be shifted to an On state by using the same mechanism (or method), thereby allowing the communication module to perform discovery of a WFD device/service by using the discovery mechanism selected by the ASP.

Hereinafter, in the exemplary embodiment of the present invention, in a Wi-Fi Display (WFD) (Miracast) of the Wi-Fi Alliance (WFA), a WFD source (or source device) and a WFD sink (or sink device) may be operated in the power save mode in accordance with the battery level of the WFD source (or source device).

According to the exemplary embodiment of the present invention, a new RTSP message may be defined for the battery state report (or batter status report) between the WFD source and the WFD sink. Hereinafter, the WFD device may correspond to a WFD source or a WFD sink.

More specifically, a new real time streaming protocol (RTSP) message for indicating the report of the information on the battery status of the WFD device may be defined, and the WFD device may transmit a M17 RTSP SET_PARAMETER message to another device (or another WFD device) and, thereafter, the WFD device may report information on the current battery status of the WFD device periodically or when a specific condition is satisfied.

Table 5 shown below discloses a RTSP message reporting information on the current battery status of the WFD device.

TABLE 5

| ID | Requester | Description |
|---|---|---|
| M17 | WFD Source (WFD2 Source) WFD Sink (WFD2 Sink) | Send RTSP SET_PARAMETER with wfd2-battery-report to indicate that the sender is entering WFD2 Battery Report Mode. |

More specifically, a report on the battery status may be requested through the M17 RTSP SET_PARAMETER message.

Alternatively, a RSTP message reporting the current battery status of the WFD device may be defined as shown below in Table 6. The WFD device may transmit a M17 RTSP SET_PARAMETER message to another WFD device, and, thereafter, the WFD device may report information on the current battery status of the WFD device to the other WFD device periodically or when a specific condition is satisfied.

TABLE 6

| ID | Requester | Description |
|---|---|---|
| M17 | WFD Source (WFD2 Source) WFD Sink (WFD2 Sink) | Send RTSP SET_PARAMETER with wfd2-battery-level-report to indicate current Battery Level Information of the WFD R2 Sender. |

The battery status information may be periodically transmitted. The WFD device may report the battery status information to another WFD device at constant intervals.

In case a specific condition is satisfied, the WFD device may report information on the battery status to another WFD device. For example, in case the battery level drops (or decreases) to a pre-defined value or below (e.g., each pre-defined value may correspond to 30%, 25%, 20%, 15%, 10%, 5%), the WFD device may report the information on the battery status to the other WFD device. A plurality of pre-defined values may be configured, and, when the battery status reaches the pre-defined value, the information on the battery status may be delivered (or transported or sent) to the other WFD device.

Also, according to the exemplary embodiment of the present invention, the WFD device may also deliver the batter state information to another WFD device based on a RTSP message. The WFD device may report information on the battery status of the WFD device based on a RTSP message with wfd2-battery-report parameter (or a RTSP message having a wfd2-battery-report parameter). The RTSP message with wfd2-battery-report parameter may correspond to a M18 RTSP SET_PARAMETER message.

Table 7 shown below discloses that the RTSP message with wfd2-battery-report parameter corresponds to a M18 RTSP SET_PARAMETER message.

TABLE 7

| ID | Requester | Description |
|---|---|---|
| M18 | WFD Source (WFD2 Source) WFD Sink (WFD2 Sink) | Send RTSP SET_PARAMETER with wfd2-battery-status parameter to indicate current battery status of sender. |

Also, according to the exemplary embodiment of the present invention, the WFD device may also define a message for querying the battery status to another WFD device. In this case, the WFD device, which has received the RTSP M18 request message, may include a wfd2-battery-status parameter in a RTSP M18 response message and may transmit the corresponding response message to its counterpart WFD device.

Table 8 shown below discloses that the RTSP message with wfd2-battery-report parameter corresponds to a M18 RTSP SET_PARAMETER message.

TABLE 8

| ID | Requester | Description |
|---|---|---|
| M18 | WFD Source (WFD2 Source) WFD Sink (WFD2 Sink) | Query (or request) wfd2-battery-status parameter. |

Figure 11:
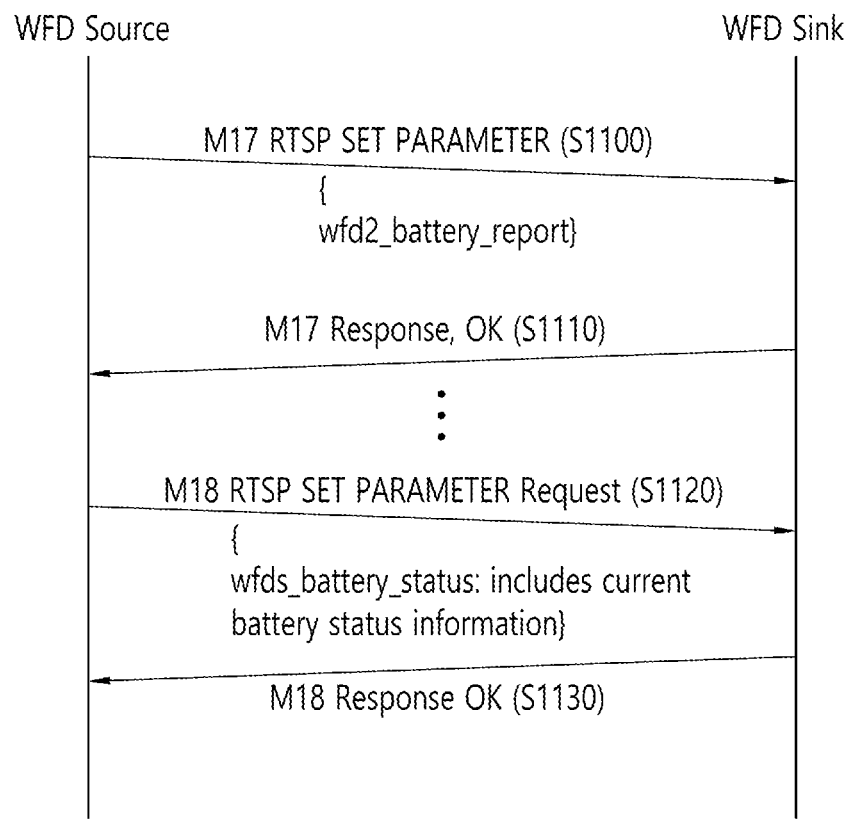
FIG. 11 is a flow chart illustrating a battery status report according to an exemplary embodiment of the present invention.

FIG. 11 is a flow chart illustrating a battery status report according to an exemplary embodiment of the present invention.

Referring to FIG. 11, in order to enter the battery status report mode for reporting the battery status, the WFD source may transmit a M17 RTSP SET_PARAMETER request message including a wfd2-battery_report parameter to the WFD sink (step S1100).

The WFD sink that has received the M17 RTSP SET_PARAMETER request message may receive a M17 RTSP response message (with okay) notifying that the M17 RTSP SET_PARAMETER request message has been received (step S1110).

The WFD source may exchange RTSP M17 messages with the WFD sink in order to report the information on the battery status, and, then, the WFD source may transmit the battery status information of the WFD source to the WFD sink through the M18 RTSP SET PARAMETER request message (step S1120).

The WFD sink device that has received the M18 RTSP SET_PARAMETER request message may respond to the received message by sending a M18 response message (with Okay) (step S1130). The M18 message may be periodically transmitted by the user equipment (or device), or the M18 message may be transmitted in case a specific condition is satisfied (e.g., in case the battery level drops (or decreases) to a predetermined value or below).

Figure 12:
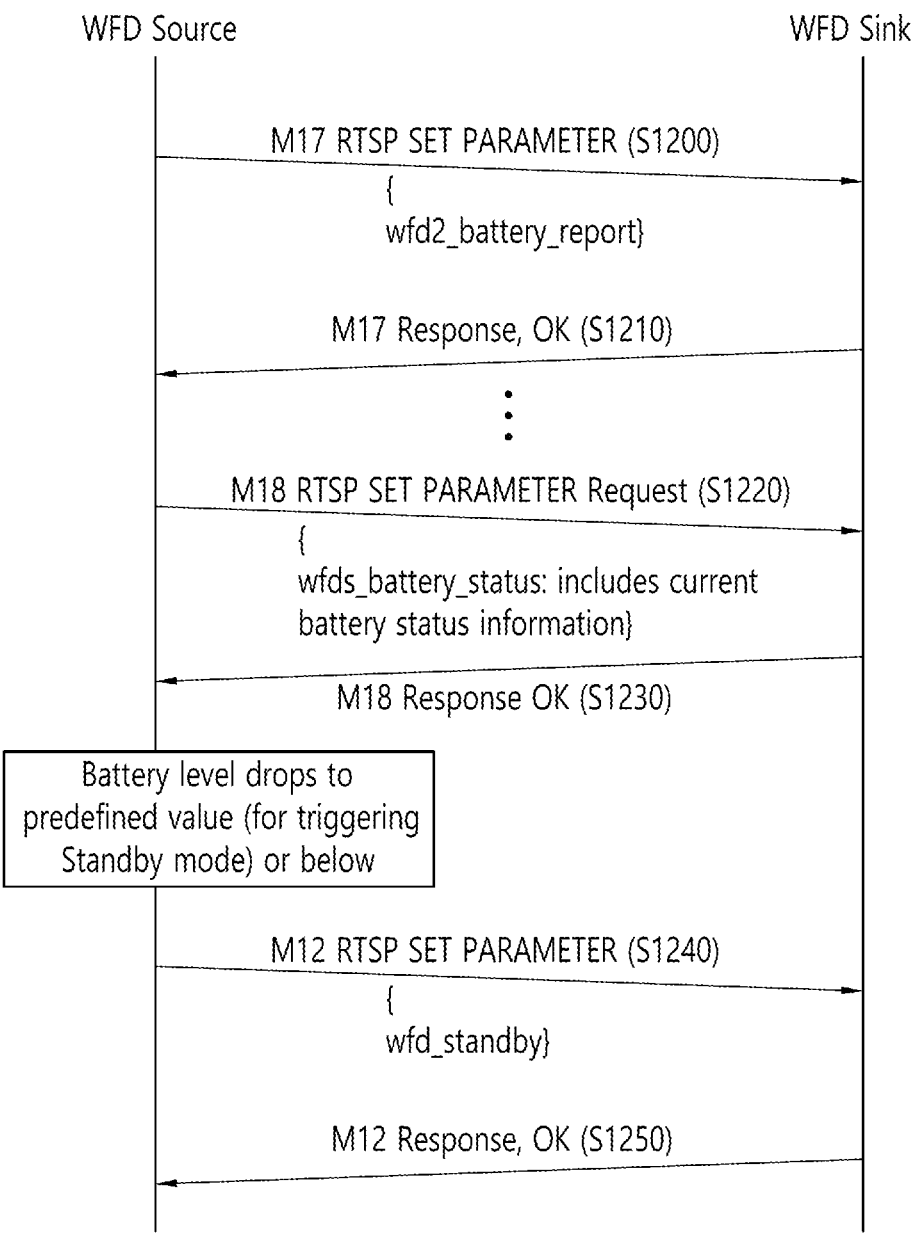
FIG. 12 is a flow chart illustrating a battery status report according to an exemplary embodiment of the present invention.

FIG. 12 is a flow chart illustrating a battery status report according to an exemplary embodiment of the present invention.

FIG. 12 discloses a method of the WFD source for initiating a Standby mode on its own. The WFD source may be operated in the Standby mode (Power Save mode).

Referring to FIG. 12, the WFD source may transmit a M17 RTSP SET_PARAMETER request message including a wfd2-battery_report parameter in order to enter the mode for reporting the battery status of the WFD device (step S1200). The WFD sink, which has received the M17 RTSP SET_PARAMETER request message, may respond to the received message by sending a M17 response message (with okay) (step S1210).

The WFD source may exchange the M17 message for reporting the battery status information, and, then, by performing indication based on a wfd2_battery_status parameter, the WFD source may transmit the battery status information to the WFD sink through the M18 RTSP SET_PARAMETER request message (step S1220).

The WFD sink, which has received the M18 RTSP SET_PARAMETER request message, may respond to the received massage by sending a M18 response message (with Okay) (step S1230). In case the battery level of the WFD source decreases to a predetermined value or less, the WFD source may transmit a M12 RTSP SET_PARAMETER request message, which notifies its operation in the Standby mode, to the WFD sink and may then enter the Standby mode (step S1240).

In the Standby mode, the WFD source may maintain a Doze state without any additional communication with the WFD sink.

The WFD sink may transmit a M12 response message to the WFD source (step S1250).

Figure 13:
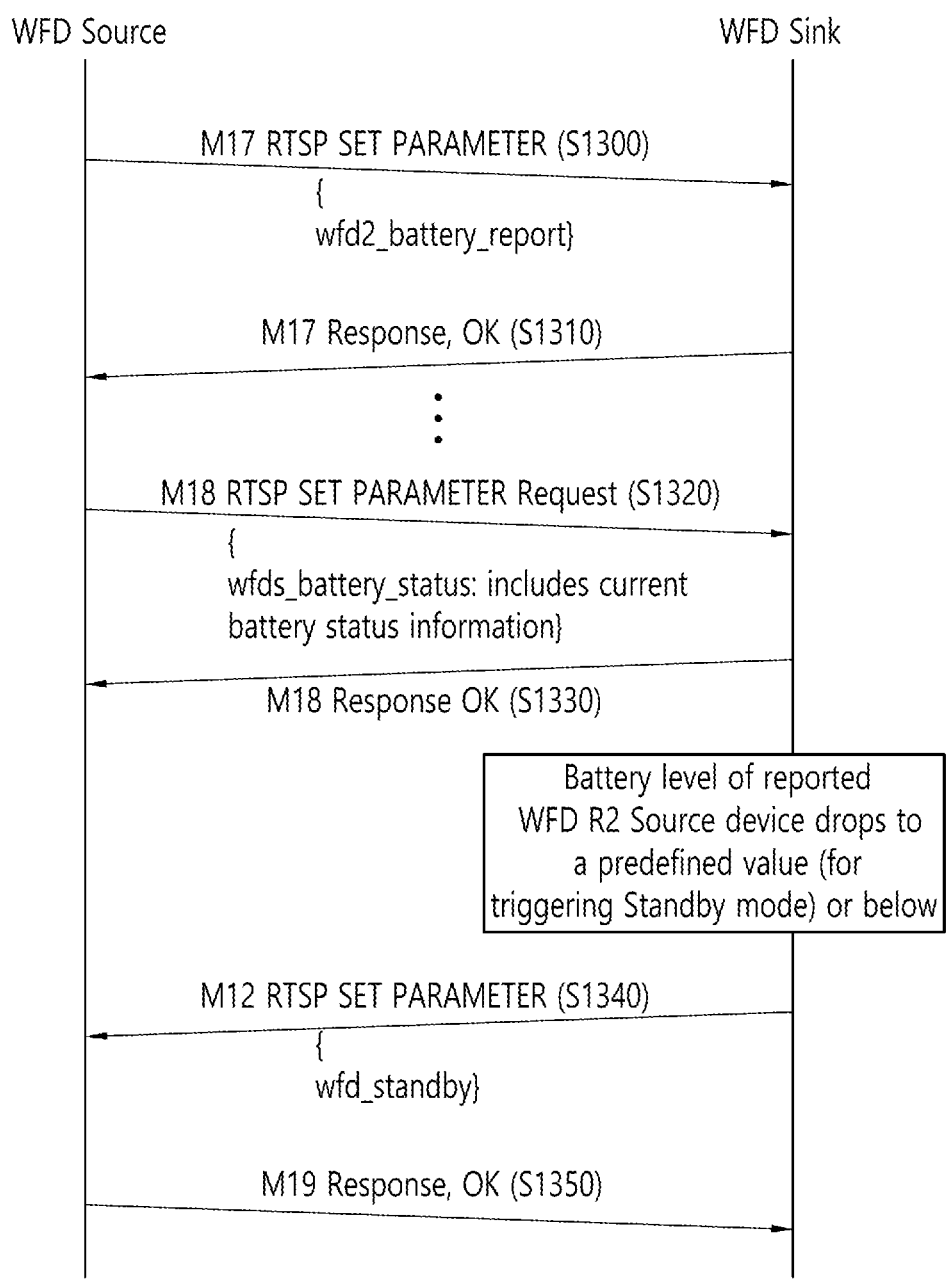
FIG. 13 is a flow chart illustrating a battery status report according to an exemplary embodiment of the present invention.

FIG. 13 is a flow chart illustrating a battery status report according to an exemplary embodiment of the present invention.

FIG. 13 discloses a method of the WFD sink for triggering the operation of the WFD source in the Standby mode.

Referring to FIG. 13, the WFD source may transmit a M17 RTSP SET_PARAMETER request message including a wfd2-battery_report parameter in order to enter the mode for reporting the battery status (step S1300). The WFD sink, which has received the M17 RTSP SET_PARAMETER request message, may respond to the received message by sending a M17 response message (with okay) (step S1310).

The WFD source may exchange the M17 message for reporting the battery status information, and, then, the WFD source may transmit a M18 RTSP SET_PARAMETER request message including a wfd2 battery status parameter, which indicates the battery status information (step S1320).

The WFD sink, which has received the M18 RTSP SET_PARAMETER request message may respond to the received message by sending a M18 response message (with okay) (step S1330).

The WFD sink may receive the battery status information that is reported by the WFD source, and when the WFD sink determines that the battery level of the WFD source has decreased to a predetermined level or less, the WFD sink may transmit a M19 RTSP SET_PARAMETER message so as to trigger the Standby mode (Power Save mode) of the WFD source (step S1340).

The WFD sink may transmit a M19 response message to the WFD source (step S1350).

TABLE 9

| ID | Requester | Description |
|---|---|---|
| M19 | WFD Sink (WFD2 Sink) | Trigger WFD Source to enter WFD Standby mode by sending RTSP SET_PARAMETER with wfd2-standby. |

A wfd2-standby format may be defined in order to shift the receiver of the RTSP SET_PARAMETER request message, which includes the wfd2-standby parameter, to the WFD standby mode. The WFD device, which has received the RTSP SET_PARAMETER request message including the wfd2-standby parameter may enter the Standby mode.

A predetermined value for the transmission of the wfd2-battery-status is as described below.

As a value that is applied for transmitting the battery status information to the WFD device, the predetermined value for the transmission of the wfd2-battery-status may be defined as a global value. Alternatively, the predetermined value for the transmission of the wfd2-battery-status may be negotiated through an exchange of M17 RTSP messages for the battery report mode entry.

In case a negotiation is carried out when exchanging M17 RTSP messages, a predetermined value may be indicated through the wfd2-battery-report parameter as described below.

TABLE 10 wfd2 battery report parameter

"wfd2-battery-report = "wfd2-battery-report:" SP battery-level-for-sending-battery-status SP battery-level-for-triggering-standby-mode CRLF
battery-level-for-sending-battery-status = N*H HEXDIG; indicates predefined battery level for sending battery status information.
battery-level-for-entering-standby-mode = N*N HEXDIG; indicates predefined battery level for triggering standby mode.

According to the exemplary embodiment of the present invention, in the step of capability negotiation between the devices through a WFD extended capability bitmap, the WFD source may include WFD R2 battery level report support bit information, which is shown below in Table 11, in a RTSP M3 message and may transmit the message including the corresponding information to the WFD sink.

TABLE 11

| Name | Interpretation |
| --- | --- |
| WFD R2 Battery Level Report Support Bit | 0b0: Not supported<br>0b1: Supported |

During a WFD session, the WFD device may perform the procedure of indicating the reporting of the information on the battery status by transmitting the RTSP M17 request message after carrying out a negotiation that is based on the RTSP M3 message including the WFD battery level report support bit information, which is shown in Table 11.

Figure 14:
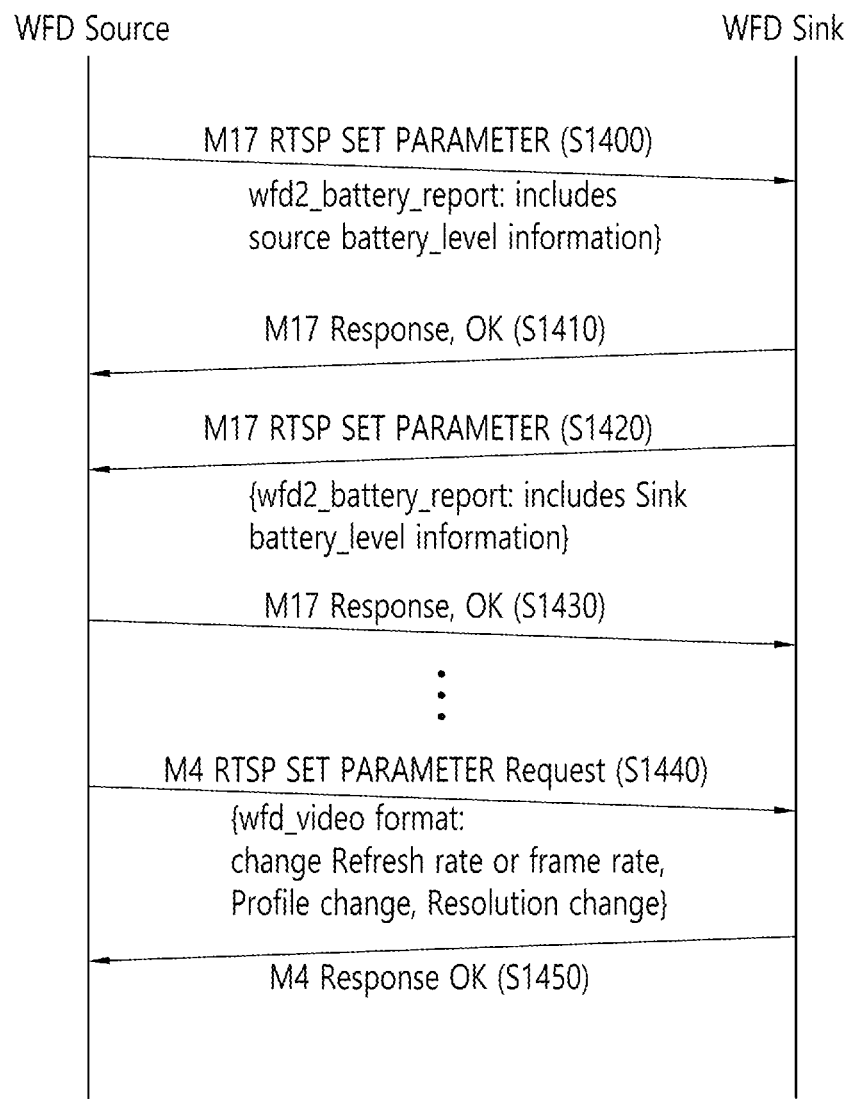
FIG. 14 is a flow chart illustrating a battery status report according to an exemplary embodiment of the present invention.

FIG. 14 is a flow chart illustrating a battery status report according to an exemplary embodiment of the present invention.

FIG. 14 discloses a method of WFD source for adjusting an operation format based on the battery status information of the WFD sink.

Referring to FIG. 14, the WFD source may report the information on the battery level of the WFD source.

The WFD source may transmit information on the battery level through a M17 RTSP SET_PARAMETER request message to the WFD sink (step S1400). The WFD sink may respond to the received message by sending a M17 response message (with Okay) (step S1410).

Also, the WFD sink may transmit the information on the battery level through the M17 RTSP SET_PARAMETER request message to the WFD source (step S1420).

The WFD source may respond to the received message by sending a M17 response message (with Okay) (step S1430).

The M17 message may be periodically transmitted by the WFD source/WFD sink, or the M17 message may be transmitted only in case a when the battery level drops (or decreases) to a specific condition or below.

The WFD source may change the WFD video format information by referring to the battery level of the WFD source and the battery level of the WFD sink. For example, the WFD source may transmit a M4 SET_PARAMETER request message to the WFD sink and may renegotiate the WFD video format information (step S1440).

The WFD video format information may include a refresh rate/frame rate, a Codec profile, and a Video resolution as the information on the wfd video format to which the change in the video format is to be made.

The WFD sink may transmit a M4 response message to the WFD source (step S1450).

Figure 15:
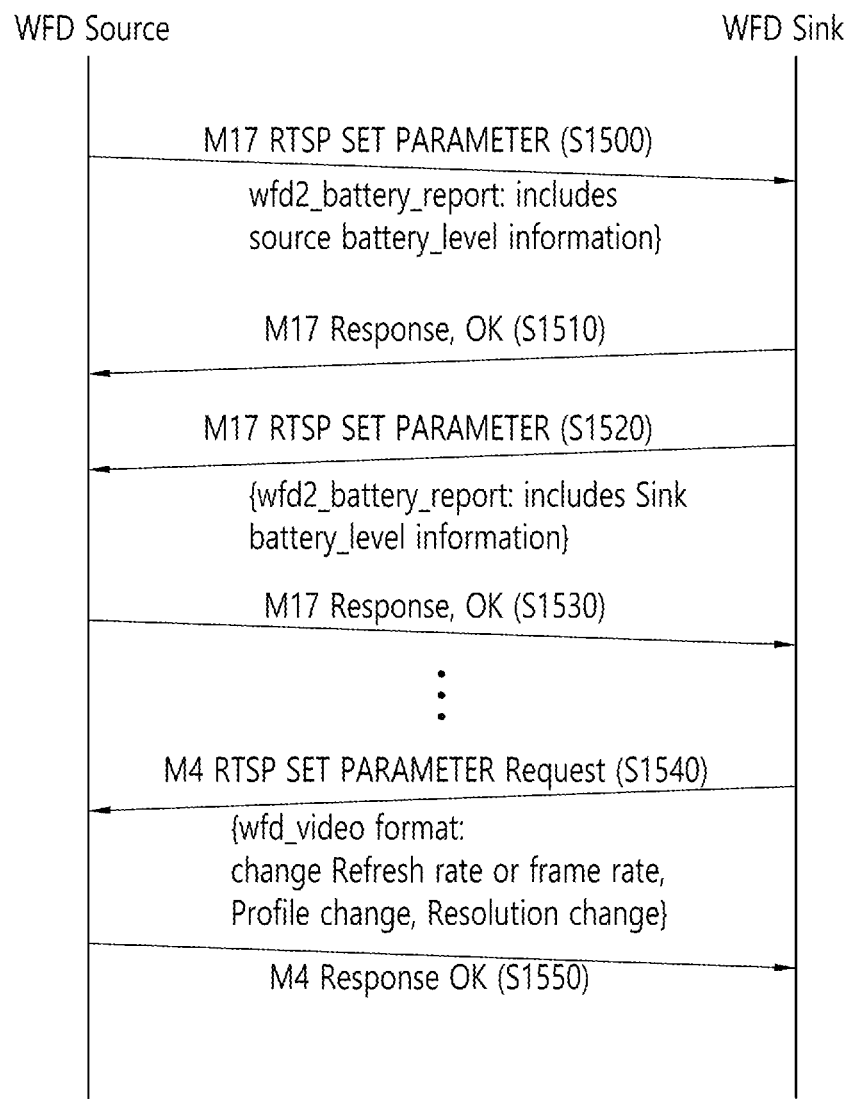
FIG. 15 is a flow chart illustrating a battery status report according to an exemplary embodiment of the present invention.

FIG. 15 is a flow chart illustrating a battery status report according to an exemplary embodiment of the present invention.

FIG. 15 discloses a method of WFD source for adjusting an operation format based on the battery status information of the WFD sink.

Referring to FIG. 15, the WFD source may report the information on the battery level of the WFD source.

The WFD source may transmit information on the battery level through a M17 RTSP SET_PARAMETER request message to the WFD sink (step S1500). The WFD sink may respond to the received message by sending a M17 response message (with Okay) (step S1510).

Also, the WFD sink may transmit the information on the battery level through the M17 RTSP SET_PARAMETER request message to the WFD source (step S1520).

The WFD source may respond to the received message by sending a M17 response message (with Okay) (step S1530).

The M17 message may be periodically transmitted by the WFD source/WFD sink, or the M17 message may be transmitted only in case a when the battery level drops (or decreases) to a specific condition or below.

The WFD sink may change the WFD video format information by referring to the battery level of the WFD sink and the battery level of the WFD source. For example, the WFD sink may transmit a M4 SET_PARAMETER request message to the WFD source and may renegotiate the WFD video format information (step S1540).

The WFD video format information may include a refresh rate/frame rate, a Codec profile, and a Video resolution as the information on the wfd video format to which the change in the video format is to be made.

The WFD sink may transmit a M4 response message to the WFD source (step S1550).

Figure 16:
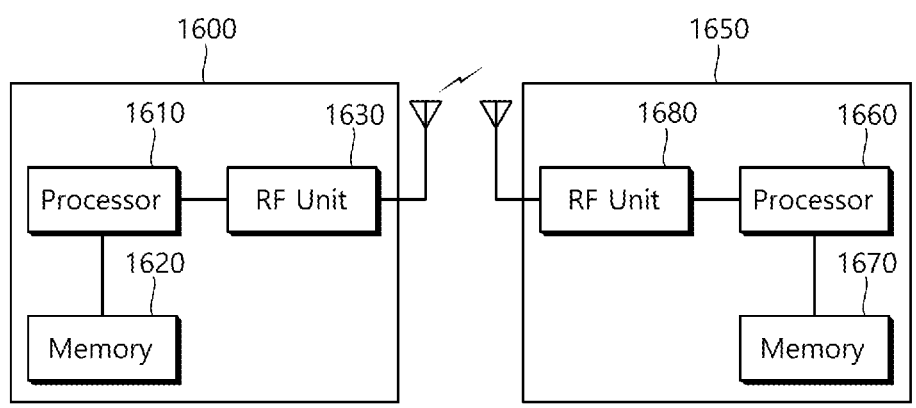
FIG. 16 is a block view illustrating a wireless device to which the exemplary embodiment of the present invention can be applied.

FIG. 16 is a block view illustrating a wireless device to which the exemplary embodiment of the present invention can be applied.

Referring to FIG. 16, the wireless device may correspond to a WFD source 1600 and a WFD sink 1650 that can embody the above-described exemplary embodiment of the present invention.

The WFD source 1600 includes a processor 1610, a memory 1620, and a radio frequency (RF) unit 1630.

The RF unit 1630 is connected to the processor 1610, thereby being capable of transmitting and/or receiving radio signals.

The processor 1610 implements the functions, processes, and/or methods proposed in the present invention. For example, the processor 1610 may be implemented to perform the operations of the WFD source 1600 according to the above-described exemplary embodiments of the present invention. The processor may perform the operations of the WFD source 1600, which are disclosed in the exemplary embodiments of FIG. 1 to FIG. 15.

For example, the processor 1610 may be configured to determine at least one available discovery mechanism based on a battery level indicator bitmap and a battery level threshold value, to select one discovery mechanism among the at least one available discovery mechanism, and to discover a service or another WFD device based on the selected one discovery mechanism.

The battery level indicator bitmap may include information on a remaining battery amount that remains in the WFD device, and the battery level threshold value may correspond to a threshold value for determining at least one available discovery mechanism.

The at least one available discovery mechanism may be determined based on an Application Service Platform (ASP) layer of the WFD device, and the at least one available discovery mechanism may correspond to peer to peer (P2P), neighbor awareness networking (NAN), near field communication (NFC), Bluetooth low energy (LE), or WiFi infrastructure.

Additionally, the processor 1610 may also be configured to transmit a first real time streaming protocol (RTSP) message, which indicates an entry to the battery report mode, to a second WFD device, to transmit a second RTSP message including battery status information to the second WFD device, and, in case the battery level being indicated by the battery status information is equal to a predetermined value or below, to allow the first WFD device to transmit a third RTSP message notifying the operation in the power save mode to the second WFD device.

The battery report mode may correspond to an operation mode indicating the report of the battery status information, and the first WFD device may correspond to the WFD source, and the second WFD device may correspond to the WFD sink.

The WFD sink 1650 includes a processor 1660, a memory 1670, and a radio frequency (RF) unit 1680.

The RF unit 1680 is connected to the processor 1660, thereby being capable of transmitting and/or receiving radio signals.

The processor 1660 implements the functions, processes, and/or methods proposed in the present invention. For example, the processor 1660 may be implemented to perform the operations of the WFD sink 1650 according to the above-described exemplary embodiments of the present invention. The processor may perform the operations of the WFD sink 1650, which are disclosed in the exemplary embodiments of FIG. 1 to FIG. 15.

For example, in case the battery level that is indicated by the battery status information being included in the RTSP message, which is received by another WFD device, is equal to a predetermined value or below, the processor 1660 may be configured to transmit a RTSP message indicating an operation in the power save mode to the other WFD device.

The processor 1610 and 1660 may include an application-specific integrated circuit (ASIC), another chip set, a logical circuit, a data processing device, and/or a converter converting a baseband signal and a radio signal to and from one another. The memory 1620 and 1670 may include a read-only memory (ROM), a random access memory (RAM), a flash memory, a memory card, a storage medium, and/or another storage device. The RF unit 1630 and 1680 may include one or more antennas transmitting and/or receiving radio signals.

When the exemplary embodiment is implemented as software, the above-described method may be implemented as a module (process, function, and so on) performing the above-described functions. The module may be stored in the memory 1620 and 1670 and may be executed by the processor 1610 and 1660. The memory 1620 and 1670 may be located inside or outside of the processor 1610 and 1660 and may be connected to the processor 1610 and 1660 through a diversity of well-known means.

What is claimed is:

1. A method for reporting a battery status in a Wi-Fi display (WFD), comprising:
   determining, by a first WFD device, at least one available discovery mechanism based on a battery level indicator bitmap and a battery level threshold value;
   selecting, by the first WFD device, one discovery mechanism among the at least one available discovery mechanism; and
   discovering, by the first WFD device, a service or a second WFD device based on the selected one discovery mechanism,
   wherein the battery level indicator bitmap includes information on a remaining battery amount that remains in the first WFD device,
   wherein the battery level threshold value is related to a threshold value for determining the at least one available discovery mechanism,
   wherein the at least one available discovery mechanism is determined based on an Application Service Platform (ASP) layer of the first WFD device, and
   wherein the at least one available discovery mechanism is related to peer to peer (P2P), neighbor awareness networking (NAN), near field communication (NFC), Bluetooth low energy (LE), or WiFi infrastructure,
   wherein, if a communication circuit for performing the one discovery mechanism is in an Off state, the ASP entity transmits information on the one discovery mechanism to an application entity of the first WFD device through a service entity of the first WFD device,
   wherein the application entity shifts the communication circuit to an On state, and
   wherein the application entity sends, to the ASP entity through the service entity, information for performing discovery of the service or the second WFD device based on the one discovery mechanism.

2. The method of claim 1, further comprising:
   transmitting, by the first WFD device, a first real time streaming protocol (RTSP) message including information on an entry to a battery report mode to the second WFD device;
   transmitting, by the first WFD device, a second RTSP message including battery status information to the second WFD device; and
   if a battery level related to the battery status information is equal to a predetermined value or below, transmitting, by the first WFD device, a third RTSP message notifying operation in a power save mode to the second WFD device.

3. The method of claim 1, further comprising:
   transmitting, by the first WFD device, a first real time streaming protocol (RTSP) message including information on an entry to a battery report mode to the second WFD device;
   transmitting, by the first WFD device, a second RTSP message including battery status information to the second WFD device; and
   if a battery level related to the battery status information is equal to a predetermined value or below, receiving, by the first WFD device, a third RTSP message notifying operation in a power save mode from the second WFD device.

4. A first Wi-Fi display (WFD) device reporting battery status, comprising:
- a radio frequency (RF) unit transmitting or receiving radio signals; and
- a processor being operatively connected to the RF unit,
- wherein the processor is configured:
- to determine at least one available discovery mechanism based on a battery level indicator bitmap and a battery level threshold value,
- to select one discovery mechanism among the at least one available discovery mechanism, and
- to discover a service or a second WFD device based on the selected one discovery mechanism,
- wherein the battery level indicator bitmap includes information on a remaining battery amount that remains in the first WFD device,
- wherein the battery level threshold value is related to a threshold value for determining the at least one available discovery mechanism,
- wherein the at least one available discovery mechanism is determined based on an Application Service Platform (ASP) layer of the first WFD device, and
- wherein the at least one available discovery mechanism is related to peer to peer (P2P), neighbor awareness networking (NAN), near field communication (NFC), Bluetooth low energy (LE), or WiFi infrastructure,
- wherein, if a communication circuit for performing the one discovery mechanism is in an Off state, the ASP entity transmits information on the one discovery mechanism to an application entity of the first WFD device through a service entity of the first WFD device,
- wherein the application entity shifts the communication circuit to an On state, and
- wherein the application entity sends, to the ASP entity through the service entity, information for performing discovery of the service or the second WFD device based on the one discovery mechanism.

5. The first WFD device of claim 4, wherein the processor is further configured:
- to transmit a first real time streaming protocol (RTSP) message including information on an entry to a battery report mode to the second WFD device,
- to transmit a second RTSP message including battery status information to the second WFD device, and
- if a battery level related to the battery status information is equal to a predetermined value or below, to transmit a third RTSP message notifying operation in a power save mode to the second WFD device.

6. The first WFD device of claim 4, wherein the processor is further configured:
- to transmit a first real time streaming protocol (RTSP) message including information on an entry to a battery report mode to the second WFD device,
- to transmit a second RTSP message including battery status information to the second WFD device, and
- if a battery level related to the battery status information is equal to a predetermined value or below, to receive a third RTSP message notifying operation in a power save mode from the second WFD device.

* * * * *